United States Patent
Launonen

(10) Patent No.: US 11,212,931 B2
(45) Date of Patent: Dec. 28, 2021

(54) SUBSEA INSTALLATION

(71) Applicant: ABB Schweiz AG, Baden (CH)

(72) Inventor: Markku Launonen, Vaasa (FI)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 16/454,530

(22) Filed: Jun. 27, 2019

(65) Prior Publication Data

US 2019/0320545 A1 Oct. 17, 2019

Related U.S. Application Data

(63) Continuation of application No. PCT/EP2017/084319, filed on Dec. 22, 2017.

(30) Foreign Application Priority Data

Dec. 28, 2016 (EP) ..................... 16207075

(51) Int. Cl.
*H05K 5/06* (2006.01)
*F15B 21/00* (2006.01)
(Continued)

(52) U.S. Cl.
CPC .......... *H05K 5/068* (2013.01); *F15B 21/006* (2013.01); *H01F 27/14* (2013.01); *F15B 1/24* (2013.01);
(Continued)

(58) Field of Classification Search
CPC .... H05K 5/068; H05K 7/20927; H01F 27/14; F15B 21/006; F15B 1/24; F15B 2201/31
See application file for complete search history.

(56) References Cited

U.S. PATENT DOCUMENTS 2,800,612 A * 7/1957 Riley .................... H01F 27/402
361/37
3,142,029 A * 7/1964 Keen, Jr. ............. H01F 27/2847
336/84 R
(Continued)

FOREIGN PATENT DOCUMENTS

EP 2511919 A1 10/2012
EP 2738780 A1 6/2014
(Continued)

OTHER PUBLICATIONS

European Patent Office, International Preliminary Report on Patentability issued in corresponding Application No. PCT/EP2017/084319, dated Nov. 27, 2018, 19 pp.
(Continued)

*Primary Examiner* — Aaron L Lembo
(74) *Attorney, Agent, or Firm* — Leydig, Voit & Mayer, Ltd.

(57) ABSTRACT

A subsea installation. The subsea installation comprises a tank containing an insulation fluid or other fluid, a heat generating electric apparatus positioned at least partly within the tanks, and a pressure compensator being in fluid communication with the tank and being configured to compensate volume variations of the insulation fluid or the other fluid by performing an expansive and a contracting movement. The subsea installation comprises further means for heating the insulation fluid or the other fluid, said means for heating being configured to provide heating to the insulation fluid or the other fluid with the heat generating electric apparatus is in a non-operating state in order to reduce the volume variations of the insulation fluid or the other fluid.

19 Claims, 4 Drawing Sheets

(51) Int. Cl.
  *H01F 27/14* (2006.01)
  *F15B 1/24* (2006.01)
  *H05K 7/20* (2006.01)
(52) U.S. Cl.
  CPC ...... *F15B 2201/31* (2013.01); *H05K 7/20927* (2013.01)

(56) References Cited

U.S. PATENT DOCUMENTS

| | | | |
|---|---|---|---|
| 3,264,589 A * | 8/1966 | Dutton | H01F 27/18 336/57 |
| 4,456,899 A * | 6/1984 | Matthes | H01F 27/12 336/55 |
| 5,324,886 A * | 6/1994 | Nakatake | H01F 27/321 174/12 R |
| 6,842,718 B2 * | 1/2005 | Byrd | H02H 7/04 340/646 |
| 7,220,365 B2 * | 5/2007 | Qu | C09K 5/14 252/70 |
| 7,847,189 B2 * | 12/2010 | Findeisen | H01F 27/14 174/50 |
| 7,931,090 B2 * | 4/2011 | Smedstad | E21B 43/128 166/250.15 |
| 8,203,411 B2 * | 6/2012 | MacLennan | H01F 27/327 336/55 |
| 8,267,166 B2 * | 9/2012 | Damsleth | F16L 53/32 166/57 |
| 8,327,942 B2 * | 12/2012 | Grimseth | E21B 43/01 166/368 |
| 8,405,991 B2 | 3/2013 | Roy Trudel et al. | |
| 8,439,080 B2 * | 5/2013 | Uusipaikka | E21B 33/0385 138/30 |
| 8,511,386 B2 * | 8/2013 | Rodrigues | E21B 43/124 166/344 |
| 8,519,813 B2 * | 8/2013 | MacLennan | H01F 27/10 336/67 |
| 8,604,899 B2 * | 12/2013 | Galletti | H01F 27/20 336/179 |
| 8,829,700 B2 * | 9/2014 | Wong | F03D 80/60 290/44 |
| 8,928,443 B2 * | 1/2015 | Hyde | H01F 27/2876 336/57 |
| 9,171,662 B2 | 10/2015 | Bockholt et al. | |
| 9,208,936 B2 * | 12/2015 | Smajic | H01F 27/025 |
| 9,336,939 B2 * | 5/2016 | Steiger | H01F 27/002 |
| 9,435,819 B1 * | 9/2016 | Fraley | G01M 13/045 |
| 9,502,867 B2 * | 11/2016 | Schwaiger | H01F 27/10 |
| 9,581,356 B2 * | 2/2017 | Papasideris | F24H 9/2014 |
| 9,761,366 B2 * | 9/2017 | Weber | H01F 27/025 |
| 9,845,910 B2 * | 12/2017 | Knoener | F16L 55/04 |
| 9,992,914 B2 * | 6/2018 | Best | H05K 7/20763 |
| 10,026,537 B2 * | 7/2018 | Bjoerkhaug | H01F 27/16 |
| 10,244,650 B2 * | 3/2019 | Laneryd | H05K 7/20927 |
| 10,302,702 B2 * | 5/2019 | Hencken | G01R 31/62 |
| 2003/0121651 A1 * | 7/2003 | Andersson | F28D 20/0052 165/206 |
| 2004/0156158 A1 * | 8/2004 | Walker | H05B 3/34 361/103 |
| 2009/0231075 A1 * | 9/2009 | Moia | H01F 27/12 336/61 |
| 2011/0265478 A1 * | 11/2011 | Cuhaci | F03G 7/10 60/670 |
| 2013/0286591 A1 * | 10/2013 | Myers | H05K 7/20927 361/700 |
| 2014/0035709 A1 | 2/2014 | Buckholt et al. | |
| 2014/0307384 A1 * | 10/2014 | Best | H05K 7/20781 361/679.53 |
| 2014/0320253 A1 * | 10/2014 | Carlen | H01F 27/25 336/212 |
| 2014/0327506 A1 * | 11/2014 | Gustafsson | H01F 27/025 336/58 |
| 2015/0188297 A1 * | 7/2015 | Boe | H02B 1/28 174/564 |
| 2015/0260203 A1 | 9/2015 | Launonen et al. | |
| 2016/0247622 A1 | 8/2016 | Bjoerkhaug | |
| 2016/0368800 A1 * | 12/2016 | Eriksen | E21B 36/001 |
| 2017/0005468 A1 * | 1/2017 | Tenca | H02J 50/40 |
| 2017/0118869 A1 * | 4/2017 | Folkner | H05K 7/1432 |
| 2018/0313372 A1 * | 11/2018 | Trandal | H05K 7/20927 |
| 2019/0338962 A1 * | 11/2019 | Minnoy | F24D 17/02 |

FOREIGN PATENT DOCUMENTS

| | | |
|---|---|---|
| JP | S331317 B | 2/1958 |
| JP | S5710214 A | 1/1982 |
| JP | S57119515 U | 7/1982 |
| JP | S58202512 A | 11/1983 |
| JP | H05182838 A | 7/1993 |
| JP | H071 67526 A | 7/1995 |
| JP | 2012243322 A | 12/2012 |
| WO | 0241336 A1 | 5/2002 |
| WO | 2007055588 A1 | 5/2007 |

OTHER PUBLICATIONS

European Patent Office, International Search Report & Written Opinion issued in corresponding Application No. PCT/EP2017/084319, dated May 14, 2018, 11 pp.

European Patent Office, Search Report issued in corresponding Application No. 16207075.9, dated Apr. 6, 2017, 2 pp.

Australian Patent Office, Examination Report issued in corresponding Application No. 2017390076, dated Apr. 16, 2020, 3 pp.

Japanese Patent Office, Office Action issued in corresponding Application No. 2019-535253, dated Jul. 28, 2020, 12 pp.

Korean Intellectual Property Office, Office Action issued in corresponding Application No. 10-2019-7022119, dated Dec. 23, 2020, 11 pp.

Japanese Patent Office, Office Action issued in corresponding Application No. 2019-535253, dated Dec. 11, 2020, 6 pp.

* cited by examiner

SUBSEA INSTALLATION

FIELD OF THE INVENTION

The present invention relates to a subsea installation.

BACKGROUND OF THE INVENTION

Subsea installations are assemblies comprising several apparatuses used under water. Said assemblies can be installed for example on the bottom ground of a sea. As an example of said subsea installations power transformers used under water can be mentioned. Typically these power transformers comprise a tank filled with insulation and/or cooling fluid to encounter for the high pressure due to deep water depth. Examples of the other subsea liquid filled objects are subsea motors, subsea switchgears, subsea frequency converters, rectifiers and hydraulic store tanks.

The subsea installations are used for example in modern oil and gas production in which the collection, separation, boosting and transport of production fluids takes place on the seabed. These processes require large amounts of power that has to be transferred from a remote location at suitable voltages and currents for minimum power loss, to the subsea installations.

During operation of the subsea installation, temperature and volume of the insulation and/or cooling fluid varies, whereby pressure compensation of the fluid is needed. This involves use of a pressure compensator, which is in fluid communication with the tank of the installation. The pressure compensator receives excess fluid when its temperature and volume increase, and returns the fluid back to the vessel when it cools down. The pressure compensator may also have a variable volume when it performs an expansive and a contracting movement for compensating the volume variation of the insulating fluid. An example of this type of pressure compensator is a bellow compensator.

Large pressure compensator movements due to large insulation fluid volume variations in a high hydrostatic pressure decrease mechanical cycling lifetime of the pressure compensator. Therefore only a small part of the full compensation capacity of the pressure compensator is used when the water depth is high (1 . . . 3 km) having 100 . . . 300 bar pressure in order to improve the cycling lifetime of the pressure compensator. This, in turn, will generate a need of using a high number of pressure compensators leading to an expensive price of the large subsea installations and other related subsea components.

EP 2 738 780 discloses a subsea pressure compensation arrangement comprising a vessel filled with insulating fluid, and a pressure compensator for compensating pressure variations of the insulating fluid. The arrangement comprises further a fluid connection pipe for fluid communication between the vessel and the pressure compensator, wherein the fluid connection pipe is connected to a bottom wall of the pressure compensator. A pipe opening arranged at an end of the fluid connection pipe extends above a level of the bottom wall of the pressure compensator.

BRIEF DESCRIPTION OF THE INVENTION

An object of the present invention is to provide a subsea installation to solve the above problems. The objects of the invention are achieved by a subsea installation which is characterized by what is stated in the independent claims. The preferred embodiments of the invention are disclosed in the dependent claims.

The invention is based on a subsea installation comprising a tank with an insulation fluid or other fluid. A pressure compensator is in fluid communication with the tank. The pressure compensator is configured to compensate volume variations of the insulation fluid or the other fluid by performing an expansive and a contracting movement. The subsea installation comprises further means for heating the insulation fluid or the other fluid for reducing the volume variations of the insulation fluid or the other fluid.

An advantage of the subsea installation of the invention is that it provides a longer pressure compensator lifetime and better reliability.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
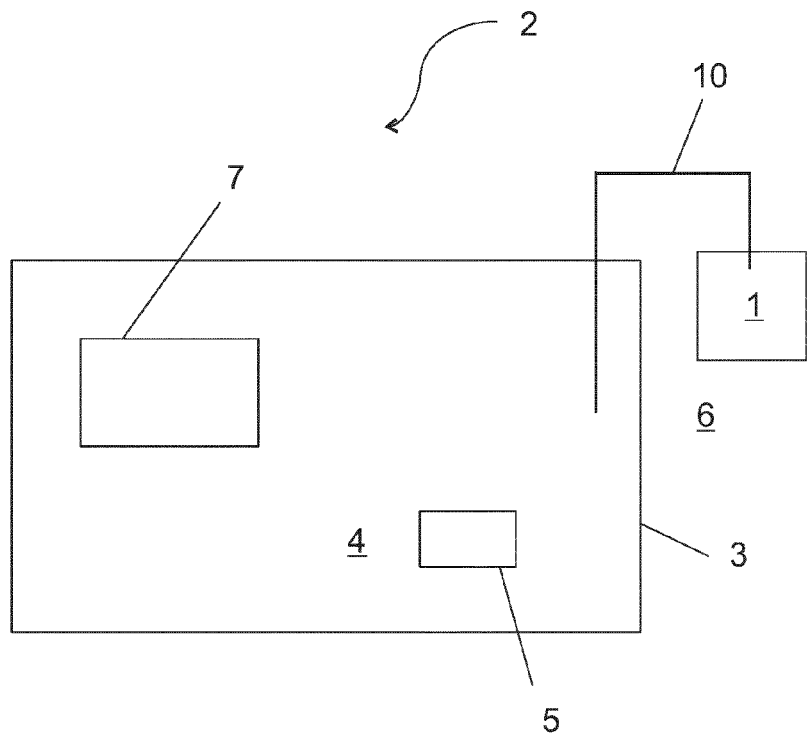
FIG. 1 shows a pressure compensator of a subsea installation.

FIG. 1 shows a pressure compensator 1 of a subsea installation 2. The subsea installation 2 comprises a tank 3 comprising an insulation fluid 4 or other fluid. The pressure compensator 1 is in fluid communication with the tank 3, and the pressure compensator 1 is configured to compensate volume variations of the insulation fluid 4 or the other fluid by performing an expansive and a contracting movement. The subsea installation 1 comprises means for heating 5 the insulation fluid 4 or the other fluid for reducing the volume variations of the insulation fluid 4 or the other fluid.

The fluid communication between the pressure compensator and the tank 3 may be provided by a connection pipe 10 as shown in FIG. 1. The pressure compensator receives excess insulation fluid 4 from the tank 3 when fluid's temperature and volume increases, and returns the insulation fluid 4 back to the tank 3 when the fluid's 4 temperature and volume decreases.

The heating of the insulation fluid 4 or the other fluid inside the tank 3 of the subsea installation 2 reduces the temperature variation of the fluid 4. The other fluid may be a cooling fluid, for instance. The reduction of temperature variation of the insulating fluid 4 or other fluid results in reduction of volume variation of the insulating fluid 4 or other fluid in the tank 3. The reduction of the volume variation reduces the number of the mechanical movements of the pressure compensator 1. Further, also the extent of the mechanical movements is reduced. This means that large amplitude cycling of the pressure compensator 1 decreases. This decreases mechanical stress and strain on the pressure compensator 1 parts in the presence of hydrostatic pressure of the sea water 6. Further, the risk of fatigue failures in the moving parts of the pressure compensator 1 due to a repetitive stress diminishes.

The reduction of the volume variations of the insulation fluid 4 or the other fluid in the tank 3 enables a better utilization of the compensation capacity of the subsea pressure compensators 1. As the number of large amplitude cycling of the pressure compensator 1 decreases larger pressure compensator axial movements in high hydrostatic pressure can be allowed leading the need of fewer pressure compensators 1, longer pressure compensator cyclic lifetime and more competitive price of the subsea installation 2.

The dimensioning of a pressure compensator 1 system of a subsea installation 2 is preferably made to allow a full volume variation of the insulation fluid 4 or the other fluid. This prevents damages in the subsea installation 2 if there is a temporal failure in the heating and/or cooling of the insulation fluid 4 or the other fluid in the tank 3. The full variation means the difference of the volumes between the volume of the insulation fluid 4 or the other fluid at the temperature reached with the full heat load produced by the heat generating electric apparatus 7 and at the temperature of the surrounding water 6.

The pressure compensator 1 of a subsea installation 2 can be used in a subsea environment, e.g. exist on the sea bed. The pressure compensator 1 of a subsea installation 2 is also suitable for deep waters, where the water depth is high, 1000 . . . 3000 m, and the prevailing pressure is 100 . . . 300 bar. The water temperature in an ocean is typically 5-6° C. in the depth of 1000 m and 0-3° C. in the depth of 3000 m.

Examples of pressure compensators 1 performing an expansive and a contracting movement are a bellow compensator 8 and a cylinder compensator 9.

A bellow compensator 8 has one or more foldable and/or flexible side walls 14 for allowing volume variations of the bellow compensator 8. For instance, a top wall 13 or a bottom wall 11 may be arranged to move vertically y to compensate for the volume variations of the insulating 4 or cooling fluid.

Figure 2:
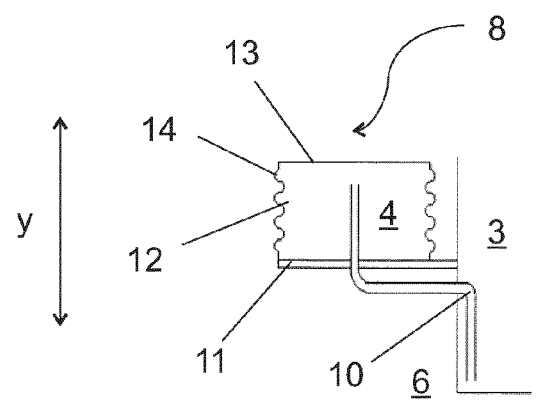
FIG. 2 shows a bellow compensator.

FIG. 2 shows a bellow compensator 8. The compensator is in fluid communication with the tank 3. The fluid communication between the bellow compensator and the tank 3 is provided by a connection pipe 10. The connection pipe 10 may enter the bellow compensator 8 through the bottom wall 11 of the compensator 8. The bottom of the bellow 12 may be arranged fixedly with respect to the tank 3. The compensator 8 is thus allowed to expand and contract such that its top wall 13 may move in the vertical direction y, and its foldable side walls 14 may straighten and fold depending on the fluid volume within the compensator 8.

The expansive and contracting movement of the bellow 12 for compensating the volume variation of the insulating fluid 4 may also be provided by the bottom wall 11. Then the bellow compensator 8 has a top wall 13 which is rigidly arranged with respect to the tank 3.

In FIG. 2, the bellow compensator 8 is mounted to the side wall of the tank 3 but the bellow compensator 8 may be arranged to the roof of the tank, for instance.

The expansive and contracting movement of the bellow 12 part of the pressure compensator 1 provides repetitive stress causing fatigue to the material of the bellow 12 part. As the cycling is reduced by controlling the volume variation the fatigue risk is diminished.

Figure 3:
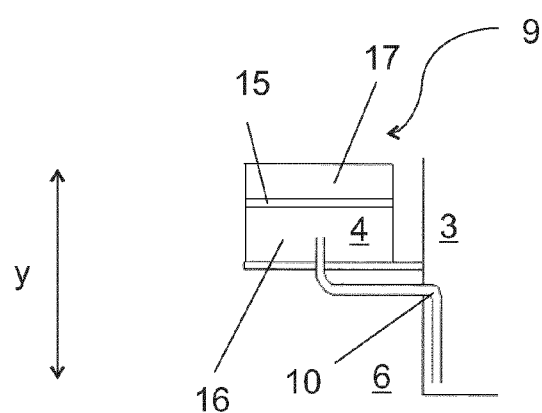
FIG. 3 shows a cylinder compensator.

FIG. 3 shows a cylinder compensator 9. A cylinder compensator 9 has a movable piston 15 which is arranged to compensate for the volume variations of the insulating fluid 4 and which separates the insulating fluid 4 from exterior seawater 6. For instance, a cylinder compensator 9 is a vertically arranged cylinder housing a piston 15, which can move vertically y due to the volume variations of the insulating 4 or another fluid, e.g. cooling fluid. Below the piston 15 is arranged a fluid space 16 for the insulating fluid 4 and above the piston 15 is a sea water space 17. The piston 15 is sealed such that mixing of the insulating fluid 4 and seawater 6 is prevented.

In the shown FIG. 1 there is shown one pressure compensator 1 but the number of the pressure compensators is naturally not limited to one but can be any number greater than one.

In an embodiment, the subsea installation comprises a heat generating electric apparatus 7. In FIG. 1 the heat generating electric apparatus 7 is a subsea transformer and the insulation fluid 4 is transformer oil. The transformer oil is mineral oil or silicon oil, for instance. Examples of other heat generating apparatuses 7 are motors, switchgears, frequency converters, rectifiers and hydraulic store tanks.

Figure 4:
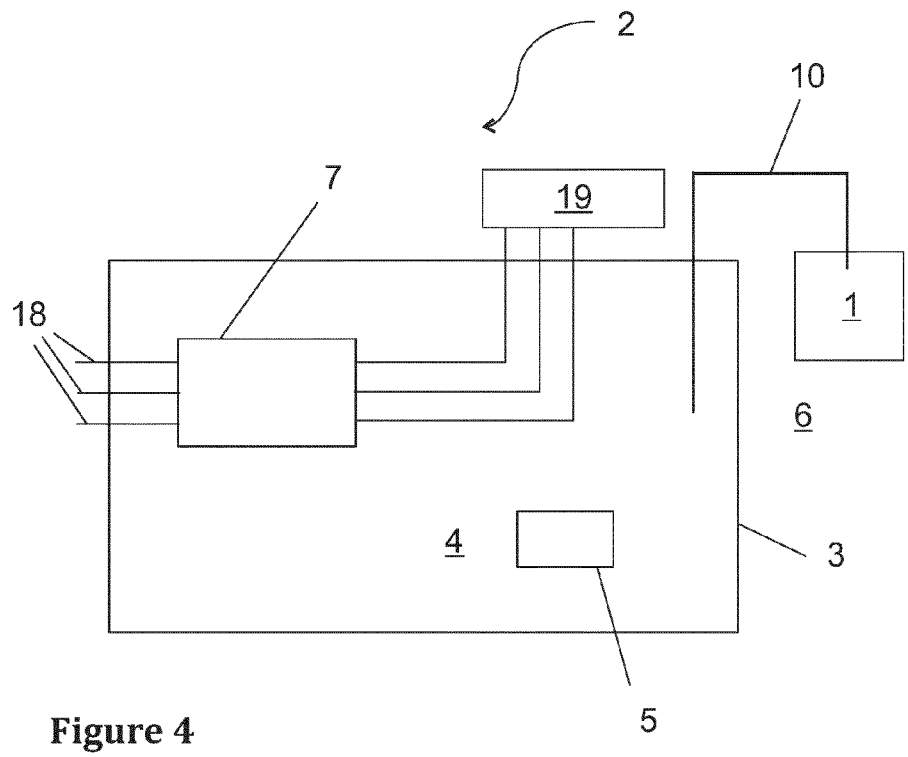
FIG. 4 shows a pressure compensator of a subsea installation.

In another embodiment, parts of the heat generating electric apparatus 7 or the total apparatus can be located within the tank 3. As shown in FIG. 4, the active parts of the transformer, i.e. the transformer windings and a transformer core, can be located within the tank 3. FIG. 4 shows also the transformer input connections 18 and the load 19 to the transformer. Same reference signs in the Figures refer to corresponding parts in Figures.

Further, the heat generating electric apparatus 7 may comprise an electric power switch and/or a variable speed drive which can be located within the tank 3, for example.

In yet another embodiment, the means for heating 5 may be configured to provide heating to the insulation fluid 4 or the other fluid when the heat generating electric apparatus 7 is in a non-operating state. The heating of the insulation fluid 4 or the other fluid prevents the cooling of the insulation fluid 4 or the other fluid close to the temperature of the surrounding water 6 when the heat generating electric apparatus 7 is not providing heating to the insulation fluid 4 or the other fluid in the tank 3. As the temperature decrease remains smaller the contracting movement of the pressure compensator 1 due to the volume reduction of the insulation fluid 4 or the other fluid remains also smaller.

Another advantage of keeping the insulation fluid 4 or the other fluid temperature higher than the surrounding water 6 is that it keeps also the parts of heat generating electric apparatus 7 located within the tank 3 at a higher temperature. For instance, the lifetime of a transformer is increased by keeping the hot spot area of the transformer winding drier.

In a further another embodiment, the means for heating 5 may be configured to gradually close down the heating to the insulation fluid 4 or the other fluid during the start-up of the heat generating electric apparatus 7.

Figure 5:
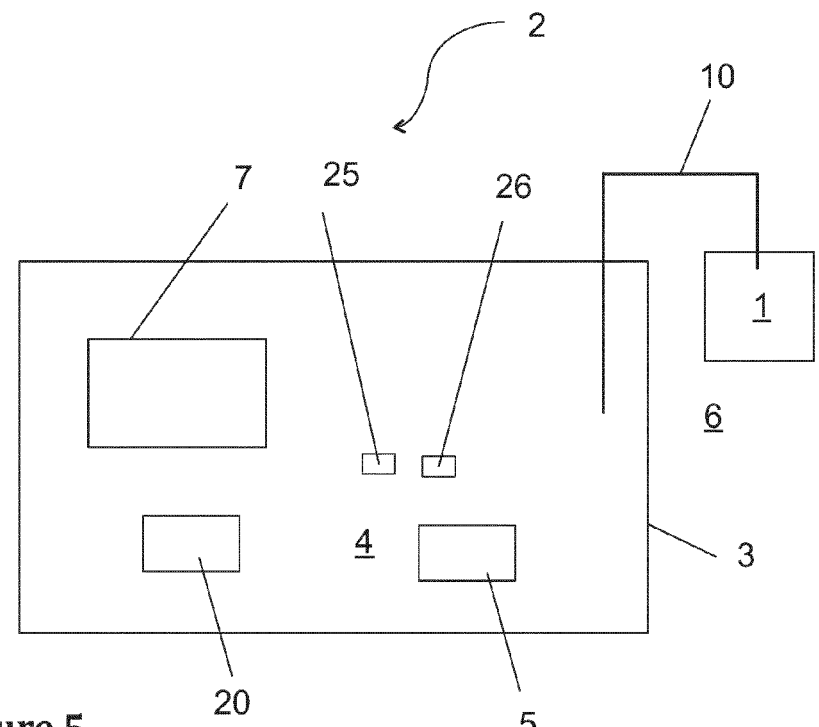
FIG. 5 shows a pressure compensator of a subsea installation.

In a still another embodiment, the subsea installation 2 may comprise means for cooling 20 the insulation fluid 4 or the other fluid for reducing the volume variations of the insulation fluid 4 or the other fluid. FIG. 5 shows a pressure compensator of a subsea installation comprising means for heating 5 and means for cooling 20.

In an embodiment, the means for cooling 20 is configured to provide cooling when the heat generating electric apparatus 7 is in an operating state. As the temperature increase remains smaller the expanding movement of the pressure compensator 1 due to the volume increase of the insulation fluid 4 or the other fluid remains also smaller.

Cooling can be provided through natural or forced convection, for instance.

Figure 6:
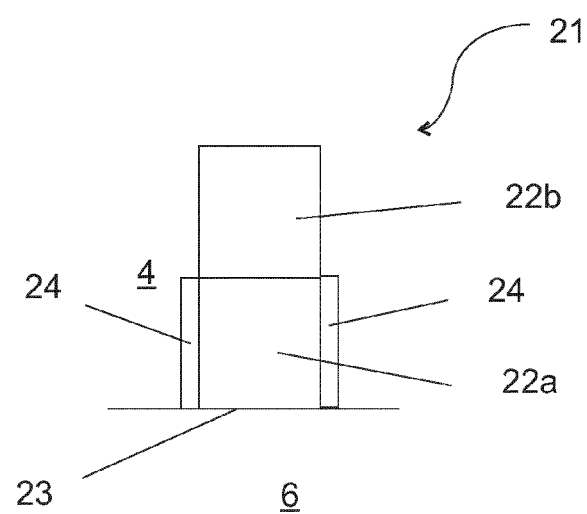
FIG. 6 shows a heat pump.

The means for cooling may be a heat pump 21 as shown in FIG. 6. The part of the heat pump 22a which is in heat transferring contact with the surrounding water 6 operates as a condenser and the part of the heat pump 22b which is in heat transferring contact with the insulating fluid 4 or the other fluid operates as an evaporator. Thus the heat pump transfers heat from the insulating fluid 4 or the other fluid in the tank 3 to the surrounding water 6.

The part of the heat pump 22a which is in heat transferring contact with the surrounding water 6 may be an external unit heat exchanger outside of the tank 3. The part of the heat pump 22a which is in heat transferring contact with the surrounding water 6 may also be integrated to an outer wall 23 of the tank 3. An example of the integration is shown in FIG. 6 where an outer wall of the tank 23 is forming a part of the condenser housing. Surrounding water 6 freely flows across an outer wall 23 of the tank 3 and cools the working fluid circulating in the heat pump 21 as the heat is dissipated through the outer wall of the tank 23 to the surrounding water 6. The part of the heat pump 22a forming the condenser is separated from the insulation fluid 4 with a cover 24 which prevents the heat transfer from the condenser to the insulation fluid 4. Another example of the integration is where the outer surface of the condenser housing may be attached, e.g. connected with thermal grease, to the outer wall 23 of the tank 3.

An advantage of controlling the insulation fluid 4 or the other fluid temperature increase by providing cooling is that it keeps also the parts of heat generating electric apparatus 7 located within the tank 3 at a lower temperature. For instance, the lifetime of a transformer is increased by keeping the temperature rise of the transformer winding within limits. Another advantage of providing cooling to a transformer is that it increases the loading capability of the transformer which is limited mainly by winding temperature. A further advantage of providing cooling to a transformer is the possibility of obtaining a higher power density in a low volume subsea transformer.

In another embodiment, the subsea installation comprises a temperature sensor 25 for measuring the temperature of the insulation fluid 4 or the other fluid, and a temperature controller 26 comprising a temperature range. The temperature sensor 25 and the temperature controller 26 are shown in FIG. 5 only. The temperature sensor 25 and the temperature controller 26 may be installed in any pressure compensator of a subsea installation presented in the Figures.

In yet another embodiment, the temperature range of the temperature controller 26 is a pre-set range or the temperature range is adjustable by remote control through data transmission.

In a further another embodiment, when the heat generating electric apparatus 7 is in an operating state the means for heating 5 is configured to provide heating if the measured temperature goes below a set temperature range and the means for cooling 20 are configured to provide cooling if the measured temperature exceeds the set temperature range.

The heat load to the insulating fluid 4 or the other fluid produced by the heat generating electric apparatus 7 depends on the loading 19 of the apparatus. Thus the need of heating or cooling the insulating fluid 4 or the other fluid in the tank varies when the heat generating electric apparatus 7 is in an operating state.

An advantage of controlling the insulation fluid 4 or the other fluid temperature to remain in a set temperature range is that the volume variations of the insulation fluid 4 or the other fluid remain in a volume range defined by the temperature variation range.

In a still another embodiment, the means for heating 5 and the means for cooling 20 is a reversible heat pump working in direction either to provide heating or to provide cooling.

The heat pump 21 shown in FIG. 6 may also present a reversible heat pump. In the heating mode the part of the heat pump 22a which is in heat transferring contact with the surrounding water 6 operates as an evaporator and the part of the heat pump 22b which is in heat transferring contact with the insulating fluid 4 or the other fluid operates as a condenser. Thus the heat pump 21 transfers heat from the surrounding water 6 to the insulating fluid 4 or the other fluid in the tank.

In the cooling mode the part of the heat pump 22a which is in heat transferring contact with the surrounding water 6 operates as a condenser and the part of the heat pump 22b which is in heat transferring contact with the insulating fluid 4 or the other fluid operates as an evaporator. Thus the heat pump 21 transfers heat from the insulating fluid 4 or the other fluid in the tank 3 to the surrounding water 6.

In an embodiment, the means for heating 5 comprises a resistive heater, an inductive heater or a heating cable with an internal temperature control or a heat pump 21.

When the heat pump is used only for heating the insulating fluid 4 or another fluid the part of the heat pump 22a which is in heat transferring contact with the surrounding water 6 operates as an evaporator and the part of the heat pump 22b which is in heat transferring contact with the insulating fluid 4 or the other fluid operates as a condenser. Thus the heat pump transfers heat from the surrounding water 6 to the insulating fluid or the other fluid in the tank 3.

The required power to the heating or cooling the insulating 4 or the other fluid can be taken with several means, e.g. by separate heating transformer or reactor.

The inventive subsea installation provides a longer lifetime for the pressure compensator and better reliability, which are key factors for a deep water subsea transformer operation. The inventive subsea installation is advantageous in case the subsea installation has a high heat generation causing large volume variations to the insulating fluid.

The inventive subsea installation can be applied to different types of subsea assemblies comprising insulation or other fluid in a tank. Examples of such subsea assemblies are subsea motors, subsea switchgears, subsea frequency converters, rectifiers and hydraulic store tanks.

It will be obvious to a person skilled in the art that, as the technology advances, the inventive concept can be implemented in various ways. The invention and its embodiments are not limited to the examples described above but may vary within the scope of the claims.

PART LIST 1 a pressure compensator; 2 a subsea installation; 3 a tank; 4 an insulation fluid; 5 means for heating; 6 water; 7 a heat generating apparatus; 8 a bellow compensator; 9 a cylinder compensator; 10 a connection pipe; 11 a bottom wall; 12 a bellow; 13 a top wall; 14 side walls; 15 a piston; 16 a fluid space; 17 a sea water space; 18 input connections; 19 a load; 20 means for cooling; 21 a heat pump; 22a-b a part of the heat pump; 23 an outer wall of a tank; 24 a cover; 25 a temperature sensor; 26 a temperature controller; y vertical direction.

The invention claimed is:

1. A subsea installation comprising:
a tank containing transformer oil;
a heat generating electric apparatus positioned at least partly within the tank;
a pressure compensator being in fluid communication with the tank and being configured to compensate volume variations of the transformer oil by performing an expansive and a contracting movement;

means for heating the transformer oil, said means for heating being configured to provide heating to the transformer oil when the heat generating electric apparatus is in a non-operating state in order to reduce the volume variations of the transformer oil; and wherein the means for heating the transformer oil is configured to provide heating to the transformer oil in response to the non-operating state of the heat generating electric apparatus.

2. The subsea installation according to claim 1, wherein the means for heating is configured to gradually close down the heating to the transformer oil during the start-up of the heat generating electric apparatus.

3. The subsea installation according to claim 1, which further comprises means for cooling the transformer oil for reducing the volume variations of the transformer oil.

4. The subsea installation according to claim 3, wherein the means for cooling is configured to provide cooling when the heat generating electric apparatus is in an operating state.

5. The subsea installation according to claim 1, which further comprises a temperature sensor for measuring the temperature of the transformer oil, and a temperature controller comprising a temperature range.

6. The subsea installation according to claim 5, wherein the temperature range of the temperature controller is a pre-set range or the temperature range is adjustable by remote control through data transmission.

7. The subsea installation according to claim 5, wherein when the heat generating electric apparatus is in an operating state the means for heating is configured to provide heating if the measured temperature goes below the temperature range and means for cooling are configured to provide cooling if the measured temperature exceeds the temperature range.

8. The subsea installation according to claim 7, wherein the means for heating and the means for cooling comprises a reversible heat pump working in either direction to provide heating or cooling.

9. The subsea installation according to claim 3, wherein the means for cooling comprises a heat pump.

10. The subsea installation according to claim 1, wherein the means for heating comprises a resistive heater or an inductive heater or a heat pump.

11. The subsea installation according to claim 1, wherein the means for heating comprises a heating cable with an internal temperature control.

12. The subsea installation according to claim 1, wherein the heat generating electric apparatus comprises a subsea transformer.

13. The subsea installation according to claim 12, wherein transformer windings and a transformer core are located within the tank.

14. The subsea installation according to claim 1, wherein an electric power switch and/or a variable speed drive are located within the tank.

15. The subsea installation according to claim 2, which further comprises means for cooling the transformer oil for reducing the volume variations of the transformer oil.

16. The subsea installation according to claim 2, which further comprises a temperature sensor for measuring the temperature of the transformer oil, and a temperature controller comprising a temperature range.

17. The subsea installation according to claim 5, wherein when the heat generating electric apparatus is in an operating state the means for heating is configured to provide heating if the measured temperature goes below the temperature range and means for cooling are configured to provide cooling if the measured temperature exceeds the temperature range.

18. The subsea installation according to claim 2, wherein the heat generating electric apparatus comprises a subsea transformer.

19. The subsea installation according to claim 2, wherein an electric power switch and/or a variable speed drive are located within the tank.

* * * * *